US008610254B2

(12) United States Patent
Zhao

(10) Patent No.: US 8,610,254 B2
(45) Date of Patent: Dec. 17, 2013

(54) APPARATUS FOR INTEGRATED CIRCUIT PACKAGING

(71) Applicant: Analog Devices, Inc., Norwood, MA (US)

(72) Inventor: Ying Zhao, Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/783,095

(22) Filed: Mar. 1, 2013

(65) Prior Publication Data

US 2013/0168839 A1    Jul. 4, 2013

Related U.S. Application Data

(63) Continuation of application No. 12/851,288, filed on Aug. 5, 2010, now Pat. No. 8,390,103.

(60) Provisional application No. 61/363,579, filed on Jul. 12, 2010.

(51) Int. Cl.
*H01L 23/495* (2006.01)

(52) U.S. Cl.
USPC .... 257/666; 257/669; 257/692; 257/E23.043; 257/E23.048

(58) Field of Classification Search
USPC .......... 257/666, 669, 692, E23.043, E23.048
See application file for complete search history.

(56) References Cited

U.S. PATENT DOCUMENTS

| | | |
|---|---|---|
| 5,723,899 A | 3/1998 | Shin |
| 5,864,470 A | 1/1999 | Shim et al. |
| 5,866,939 A | 2/1999 | Shin et al. |
| 5,942,794 A | 8/1999 | Okumura et al. |
| 5,977,615 A | 11/1999 | Yamaguchi et al. |
| 6,208,020 B1 | 3/2001 | Minamio et al. |
| 6,229,200 B1 | 5/2001 | Mclellan et al. |
| 6,242,281 B1 | 6/2001 | Mclellan et al. |
| 6,281,568 B1 | 8/2001 | Glenn et al. |

(Continued)

FOREIGN PATENT DOCUMENTS

JP    2006-237510    9/2006

OTHER PUBLICATIONS

Written Opinion of the International Preliminary Examining Authority dated Aug. 2, 2012 in International Application No. PCT/US2011/041763, in 10 pages.
International Search Report and Written Opinion mailed on Sep. 29, 2011 for International Application No. PCT/US2011/041763 filed Jun. 24, 2011.

(Continued)

*Primary Examiner* — Tu-Tu Ho
(74) *Attorney, Agent, or Firm* — Knobbe Martens Olson & Bear LLP

(57) ABSTRACT

Apparatuses are disclosed, such as those involving integrated circuit packaging. In one embodiment, a chip package includes: an encapsulation having a top surface and a bottom surface facing away from the top surface. The package further includes a leadframe including a plurality of leads. Each of the leads includes an exposed portion exposed through one of edges of the bottom surface of the encapsulation. The exposed portion has a length. At least one of exposed portions positioned along one of the edges of the bottom surface of the encapsulation has a length different from other exposed portions along the edge. The package can also include a dummy pad exposed through a corner of the bottom surface. The configuration can enhance solder joint reliability of the package when the package is attached to a printed circuit board.

19 Claims, 8 Drawing Sheets

(56) References Cited

U.S. PATENT DOCUMENTS

| | | |
|---|---|---|
| 6,661,087 B2 | 12/2003 | Wu |
| 7,102,208 B1 | 9/2006 | Lee et al. |
| 7,102,216 B1 * | 9/2006 | Foster .......................... 257/673 |
| 8,390,103 B2 | 3/2013 | Zhao |
| 2005/0212116 A1 | 9/2005 | Shimanuki et al. |
| 2007/0069343 A1 | 3/2007 | Takasou et al. |
| 2008/0211069 A1 | 9/2008 | Amano et al. |
| 2009/0243086 A1 | 10/2009 | Warren |

OTHER PUBLICATIONS

International Preliminary Report on Patentability dated Nov. 6, 2012, received in International Application No. PCT/US2011/041763, in 19 pages.

Infineon Technologies AG, "P/PG-VQFN—Plastic (Green) Very Thin Profile Quad Flat Non Leaded Package," World Wide Web Address: infineon.com/cms/packages/SMD_-_Surface_Mounted_Devices/P-PG-VQFN/P-PG-VQFN-070-1.html?_locale=en (accessed on Dec. 19, 2012).

* cited by examiner

APPARATUS FOR INTEGRATED CIRCUIT PACKAGING

CROSS-REFERENCE TO RELATED APPLICATIONS

This application is a continuation of U.S. patent application Ser. No. 12/851,288, filed on Aug. 5, 2010, entitled "APPARATUS FOR INTEGRATED CIRCUIT PACKAGING," which claims the priority benefit under 35 U.S.C. §119(e) of U.S. Provisional Patent Application No. 61/363,579, filed on Jul. 12, 2010, the disclosure of each of which is incorporated herein by reference in their entirety and for all purposes.

BACKGROUND

1. Field

Embodiments of the invention relate to electronic devices, and more particularly, to integrated circuit packaging.

2. Description of the Related Technology

The semiconductor industry has developed a variety of integrated circuits (ICs) that have different packaging requirements. Package attributes that are considered when choosing a package type for a particular semiconductor device include, but are not limited to: size, lead count, power and heat dissipation, field operating conditions, and cost.

IC packages are often designed to be attached to a printed circuit board (PCB) or similar interface for larger devices, using solder joints between the IC package and contact pads on the substrate. Such solder joints can experience various thermal and/or mechanical stresses during operation and/or handling. Such stresses may reduce the life of an IC inside the package, and ultimately, the life of an electronic device that includes the IC. Therefore, there is a need for providing IC package designs that can effectively resist such stresses.

SUMMARY

In one embodiment, a die package includes: an encapsulation having a top surface and a bottom surface. The bottom surface faces away from the top surface, and has a plurality of edges. The package further includes a die embedded in the encapsulation; and a leadframe including a plurality of leads. Each of the leads includes an exposed portion exposed through one of the edges of the bottom surface of the encapsulation. The exposed portion has a length. At least one of exposed portions positioned along one of the edges of the bottom surface of the encapsulation has a length different from lengths of other exposed portions along the edge.

In another embodiment, an electronic device includes: a printed circuit board (PCB) comprising conductive lands formed thereon; and a chip package comprising: an encapsulation having a top surface and a bottom surface, the bottom surface facing away from the top surface and having a plurality of edges; a die embedded in the encapsulation; and a leadframe comprising a plurality of leads, each of the leads including an exposed portion exposed through one of the edges of the bottom surface of the encapsulation, the exposed portion having a length. At least one of exposed portions positioned along one of the edges of the bottom surface of the encapsulation has a length different from other exposed portions along the edge. The device further includes solder joints contacting and interposed between the lands and the exposed portions of the leads.

In yet another embodiment, a lead frame for a die package includes: a plurality of leads, each of which has a first end and a second end, wherein the first ends of the plurality of leads are aligned with one another. Each of the leads includes a first portion extending from the first end of the lead, and a second portion extending from part of the first portion to the second end of the lead, the first portion having a first thickness, the second portion having a second thickness thinner than the first thickness. At least one of the first portions of the leads has a length different from the lengths of the first portions of the other leads.

DETAILED DESCRIPTION OF EMBODIMENTS

Figure 1:
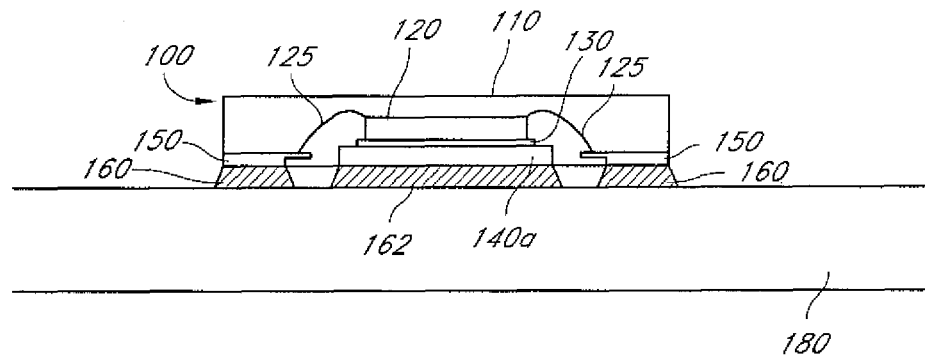
FIG. 1 is a cross-section of a conventional quad flat no lead (QFN) package with a paddle-down configuration.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Overview of Quad Flat No Leads Packages

An integrated circuit (IC) package is designed to both protect an IC (also known as a "die" or "chip") and to facilitate electrical connection to larger electronic devices. An IC package typically includes an encapsulant, a die embedded in the encapsulant, and a substrate with leads, such as a lead frame at least partially embedded in the encapsulant. A lead frame can include a die paddle, to which the die is attached, and leads, which serve as the means for external electrical connection to external circuitry. The die is connected to the leads by wires through wirebonding or by tape automated bonds.

A Quad Flat No Leads (QFN) package is a relatively small, typically rectangular surface-mount plastic package. A QFN package typically includes a planar lead frame having leads that are typically flush with encapsulant at the bottom of the package. The leads can have no protrusions (saw-singulated)

or very small protrusions (punched) from the sides of the package. Thus, a QFN package is often referred to as being "leadless" because the leads become contacts at the package surface, rather than protrusions.

A QFN package thus includes contacts or exposed portions of leads (alternatively, referred to as "external leads") around the periphery of the bottom of the QFN package that serve as electrical connection points to an external device, for example, via a printed circuit board (PCB). Because the QFN has substantially no leads protruding from its sides, and has shorter bond wire lengths, it exhibits less inductance than packages with protruding leads, and therefore provides a higher electrical performance. A QFN package can also be referred to as a "micro leadframe package."

A QFN package can be formed by individually or collectively encapsulating an array of chips on a leadframe, and then punching or sawing the encapsulated chips to be singulated. An inverted QFN package can include an exposed thermal paddle (or thermal pad), on the side of the package opposite the leads, to improve heat dissipation from the package.

Referring to FIG. 1, one example of a conventional QFN package with a paddle-down configuration is shown. The illustrated QFN package 100 includes an encapsulation 110, a die 120, bond wires 125, an adhesive 130, a thermal paddle 140a, and a lead frame 150. The term "thermal paddle" can also be referred to as a thermal pad, heat paddle, or heat pad. The package 100 is shown attached to a printed circuit board (PCB) 180 using solder joints 160, 162.

The encapsulation 110 serves to encapsulate the die 120, the bond wires 125, and the adhesive 130 while exposing portions of the thermal paddle 140a and the lead frame 150. The encapsulation 110 can be formed of, for example, mold compound, such as epoxy.

The die 120 (or an integrated circuit or chip) is often formed on a semiconductor (e.g., silicon) substrate. The die 120 can include one or more integrated circuits (ICs) having any functionality. The IC(s) of the die 120 are electrically coupled to the lead frame 150, e.g., by the bond wires 125. The bond wires 125 can be formed of, for example, aluminum, copper, gold, or an alloy of one or more of the foregoing materials. The die 120 is physically attached to a top portion of the thermal paddle 140a, using the adhesive 130. The adhesive 130 can be a thermally conductive material that can effectively transfer heat from the die 120 to the thermal paddle 140a.

The thermal paddle 140a supports the die 120 and can also serve to dissipate heat from the die 120 to outside the QFN package 100. The thermal paddle 140a can be formed of a material with a high thermal conductance, for example, a metal. In the illustrated QFN package 100 with a paddle-down configuration, a bottom portion of the thermal paddle 140a is exposed through the bottom of the package 100, although some packaging arrangements allow for a thin layer of encapsulant across the bottom of the paddle. When exposed, as shown, the bottom portion of the thermal paddle 140a can be attached to the PCB 180, using the solder joint 162.

The lead frame 150 provides electrical connection between the circuitry of the die 120 and the PCB 180. The lead frame 150 can include a plurality of separate leads, portions of which are exposed through the peripheries of the bottom of the package 100. The exposed portions of the leads are attached to contact pads of the PCB 180, using the solder joints 160.

Figure 2A:
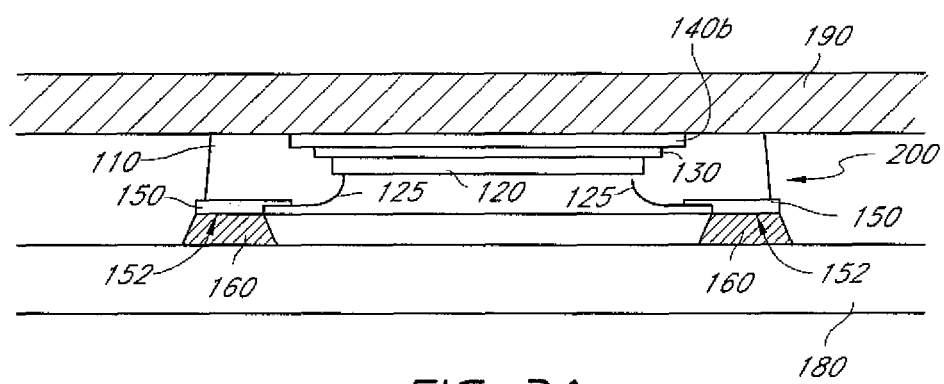
FIG. 2A is a cross-section of a conventional QFN package with a paddle-up configuration and a cold plate.

Referring to FIG. 2A, another example of a conventional QFN package with a paddle-up configuration will be described below. A QFN package with a paddle-up configuration may also be referred to as an "inverted QFN package."

The illustrated QFN package 200 includes an encapsulation 110, a die 120, bond wires 125, an adhesive 130, a thermal paddle 140b, and a lead frame 150. Details of the encapsulation 110, the die 120, the bond wires 125, the adhesive 130, and the lead frame 150 can be as described above with respect to those of the package 100 of FIG. 1.

In contrast to the thermal paddle 140a of FIG. 1, the thermal paddle 140b of FIG. 2A is positioned above the die 120. A top surface of the thermal paddle 140b is exposed through the top surface of the package 200, and is configured to contact a heat sink or cold plate 190 for heat dissipation. A bottom portion of the thermal paddle 140b is attached to the die 120 using the adhesive 130. Other details of the thermal paddle 140b can be as described above in connection with the thermal paddle 140a of FIG. 1.

Figure 2B:
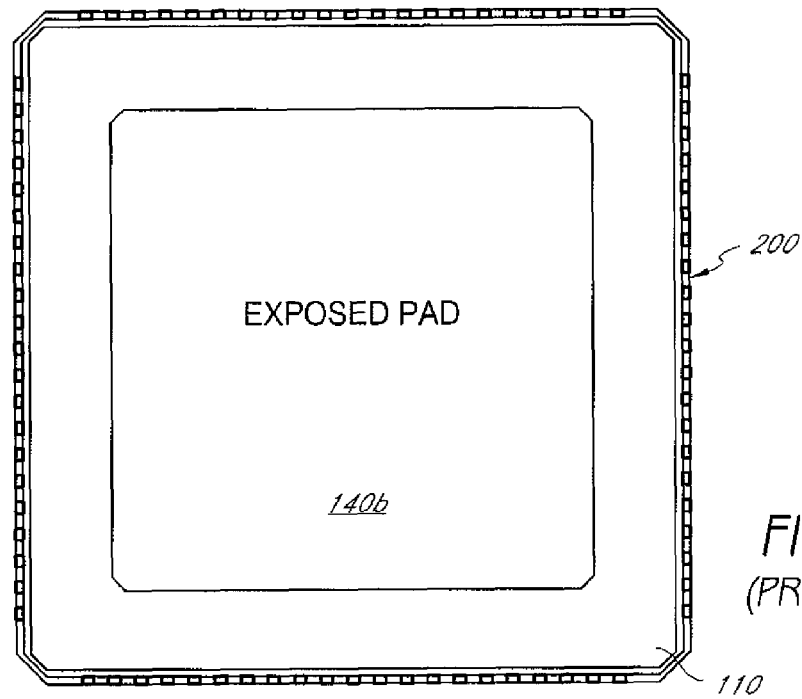
FIG. 2B is a top plan view of the QFN package of FIG. 2A.

A top plan view of the package 200 with the thermal paddle 140b exposed through the top surface of the encapsulation 110 is shown in FIG. 2B. As shown in FIG. 2B, the corners of the illustrated package 200 are chamfered. However, in other embodiments, the package 200 may include no chamfered corners.

Figure 2C:
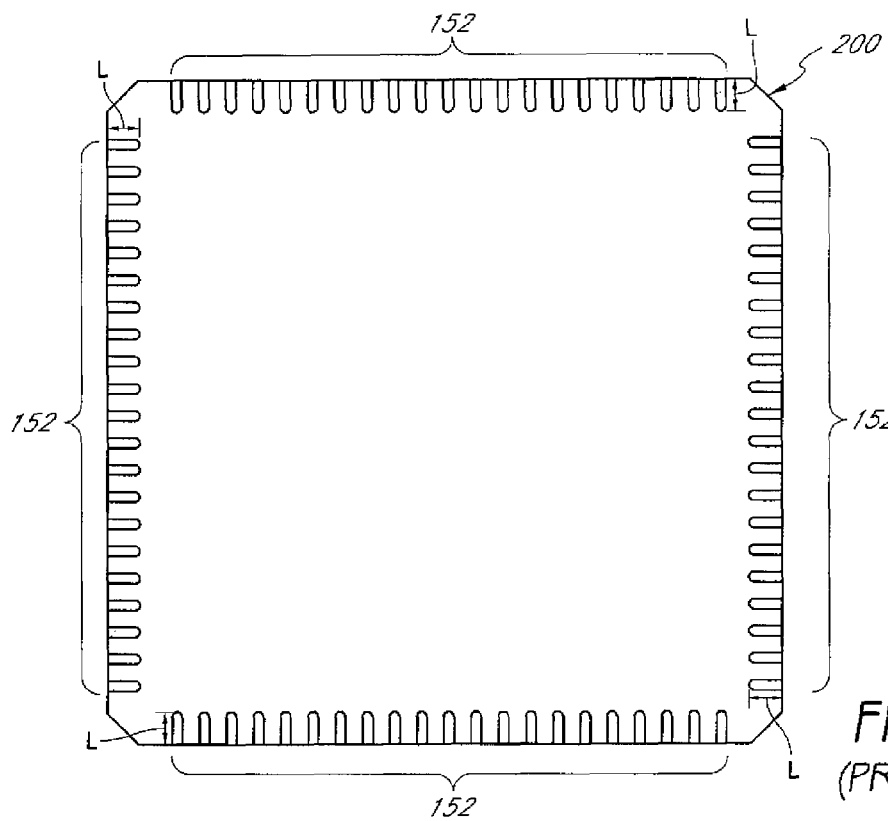
FIG. 2C is a bottom plan view of the QFN package of FIG. 2A.

Referring now to FIG. 2C, the configuration of the leads of the package 200 will be described below. FIG. 2C is a bottom plan view of the package 200 with a paddle-down configuration. Thus, the bottom of the package 200 has exposed portions 152 of leads, but not a thermal paddle. The exposed portions 152 are aligned along the four edges of the bottom of the package 200, in the illustrated embodiment along all four sides. The exposed portions 152 extend substantially parallel to one another and substantially perpendicular to the edge of the package 200 from which it extends. Each of the exposed portions 152 has a length L which is defined as a longitudinal dimension. The length L extends substantially perpendicular to the edge of the package to which it is closest.

As shown in FIG. 2C, all the exposed portions 152 along the four edges have substantially the same length as one another. This configuration has been adopted for a certain standard design for QFN, such as the Joint Electron Devices Engineering Council (JEDEC) standard. Under the JEDEC standard, all the leads of a QFN package have leads having exposed portions of the same length of about 0.4 mm to about 0.5 mm.

Figure 2D:
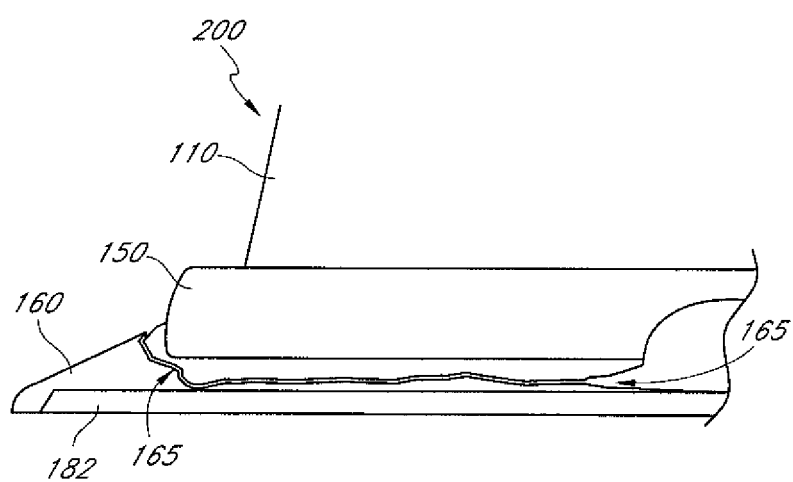
FIG. 2D is a cross-section of a portion of the QFN package of FIG. 2A attached to a printed circuit board, which illustrates a solder joint having cracks resulting from stresses.

In the QFN packages shown in FIGS. 1 and 2A, the solder joints 160, 162 can experience mechanical and/or thermal stresses which can cause cracks in the joints 160, 162. Further, the QFN package 200 with the paddle-up configuration of FIG. 2A is fixed to the PCB 180, using only the solder joint 160. In other words, the QFN package 200 does not have any other solder joint between the central portion of the bottom of the package 200 and the PCB 180. Thus, the solder joint 160 of the QFN package 200 can experience even more mechanical and/or thermal stresses than the solder joint 160 of the QFN package 100, which can share some stresses with the solder joint 162. FIG. 2D illustrates a portion of the inverted QFN package 200 that is fixed to a pad 182 of the PCB, using the solder joint 160 having cracks 165 resulting from such stresses. Such cracks may cause the IC to fail, which can be referred to as "fatigue failure."

As described above, mechanical and/or thermal stresses can reduce the solder joint reliability of a package and ultimately the life of the package. Yet, QFN packages, like any other IC packages, can avail of limited modifications to their original design because an electronic device (or its PCB or other interface substrate design) that includes the QFN packages may also need to be modified if the QFN package design is modified. Thus, there is a need for providing a solution for improving the solder joint reliability of QFN packages while minimally modifying the original design of the packages.

QFN Package with Variable Length Leads

The inventor of the present invention recognized that the lengths of exposed portions of leads of a QFN package can have a substantial impact on the solder joint reliability among other design factors. The longer the exposed portion of a lead length is, the greater the area of the solder contact with the lead is, and thus the greater the solder joint reliability is. Particularly, the lengths of exposed portions of leads can be even more significant for a QFN package with a paddle-up configuration. However, for more efficient space utilization and compatibility issues, industry standards have avoided variation of lead length.

In one embodiment, a QFN package includes leads having portions exposed through a bottom surface thereof. The exposed portions of the leads can have different lengths. The exposed portions can be extended to a maximum length, based on the location in the package, to the extent that the extended length does not interfere with internal wire bonding.

In some embodiments, the exposed portions of the leads can be grouped into two or more groups such that all exposed portions in each group have the same length while those in a group have a different length from those in another group. In one embodiment, a first group in the middle along an edge of the bottom of the package can have the longest exposed portions while a second group along the edge near a corner of the bottom of the package can have the shortest exposed portions. A third group between the two groups can have exposed portions having an intermediate length, shorter than that of the first group and longer than that of the second group. This configuration can increase contact areas between solder joints and the exposed portions, thereby enhancing solder joint reliability.

In another embodiment, the groups are symmetrically arranged on each edge of the bottom of the package to avoid imbalance stress. In such an embodiment, a plurality of edges of the bottom surface of the encapsulation can have the same pattern of exposed portions as one another.

In yet another embodiment, a printed circuit board (PCB) to which the package is soldered can have conductive lands having lengths corresponding to or proportional to the lengths of the exposed portions. In yet another embodiment, the package can have dummy pads at the corners of the bottom thereof.

In some embodiments, a lead frame can be provided for use in a QFN package. In certain embodiments, multiple lead frames can be provided as an array or network. Before encapsulation, the lead frame can include an outer frame having a plurality of strips that define an inner space surrounded by the strips. The lead frame can also include a plurality of leads extending from one of the strips inside the inner space, and tie bars extending from corners where two of the strips meet. After encapsulation, the strips can be removed, leaving the leads in the singulated package. A skilled artisan will appreciate that such a configuration is well-known in the art. In one embodiment, each of the leads can include a first portion extending from the strip, and a second portion extending from the first portion such that the first portion is interposed between the second portion and the strip. The first portion (which can form an exposed portion of a lead after encapsulation, as will be described below in detail) has a first thickness, and the second portion (which can form an internal portion of the lead after encapsulation, as will be described below in detail) has a second thickness thinner than the first thickness. At least one of the first portions of the leads positioned along the strip can have a length different from the lengths of the first portions of the other leads along the strip. A pattern formed by the lengths of the first portions can correspond to the pattern formed by the exposed portions of the QFN package described above.

The configurations in the above embodiments can enhance solder joint reliability with minimal modifications to the package design and manufacturing techniques. Further, the configurations do not require a significant design change to a PCB to which the package is attached.

Referring to FIGS. 3A-3D, one embodiment of a QFN package with variable length leads will be described below. The illustrate QFN package 300 has a paddle-up configuration, and includes an encapsulation 110, a die 120, bond wires 125, an adhesive 130, a thermal paddle 140b, and a lead frame 350. Details of the encapsulation 110, the die 120, the bond wires 125, the adhesive 130, and the thermal paddle 140b can be as described above with respect to those of the package 200 of FIG. 2A.

The lead frame 350 includes a plurality of separate leads, each of which includes an exposed portion 352 (which are exposed through the peripheries of the bottom of the package 300) and an internal portion 354 (which are embedded in the encapsulation 110). As is known in the art, the internal portion can be formed, e.g., by half-etching a masked lead frame, and the resulting overhang aids lead retention within the package encapsulation 110 despite exposure of the lead bottoms and side edges. Other reentrant profiles for forming internal leads can also be employed, as long as some portion of the lead can be embedded within the encapsulant while other portion(s) are exposed at the bottom. In the context of this document, the exposed portion 352 can also be referred to as an "external lead." Further, the internal portion 354 can also be referred to as an "internal lead."

Figure 3A:
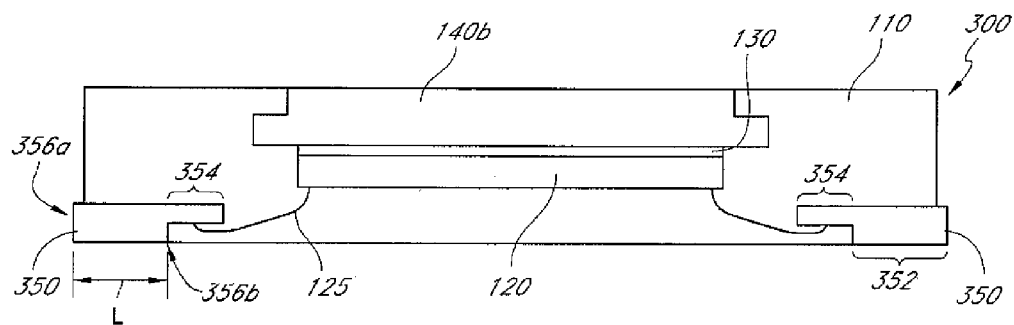
FIG. 3A is a cross-section of a QFN package with a paddle-up configuration according to one embodiment.

The exposed portion 352 of each of the leads is thicker than the internal portion 354, as shown in FIG. 3A. The internal portion 354 can have a thickness of about a half of the thickness of the exposed portion by being etched during manufacturing. The exposed portions 352 of the leads are attached to solder to be fixed to a PCB (not shown) or other electrical interface for larger electronic devices. The exposed portion 352 of each of the leads has a length L (FIG. 3A) which is defined as a longitudinal dimension between one end 356a at the outer side of the package 300 and the other end 356b at the inner side of the package 300, bordering on the reentrant profile that forms the internal leads 354.

Figure 3B:
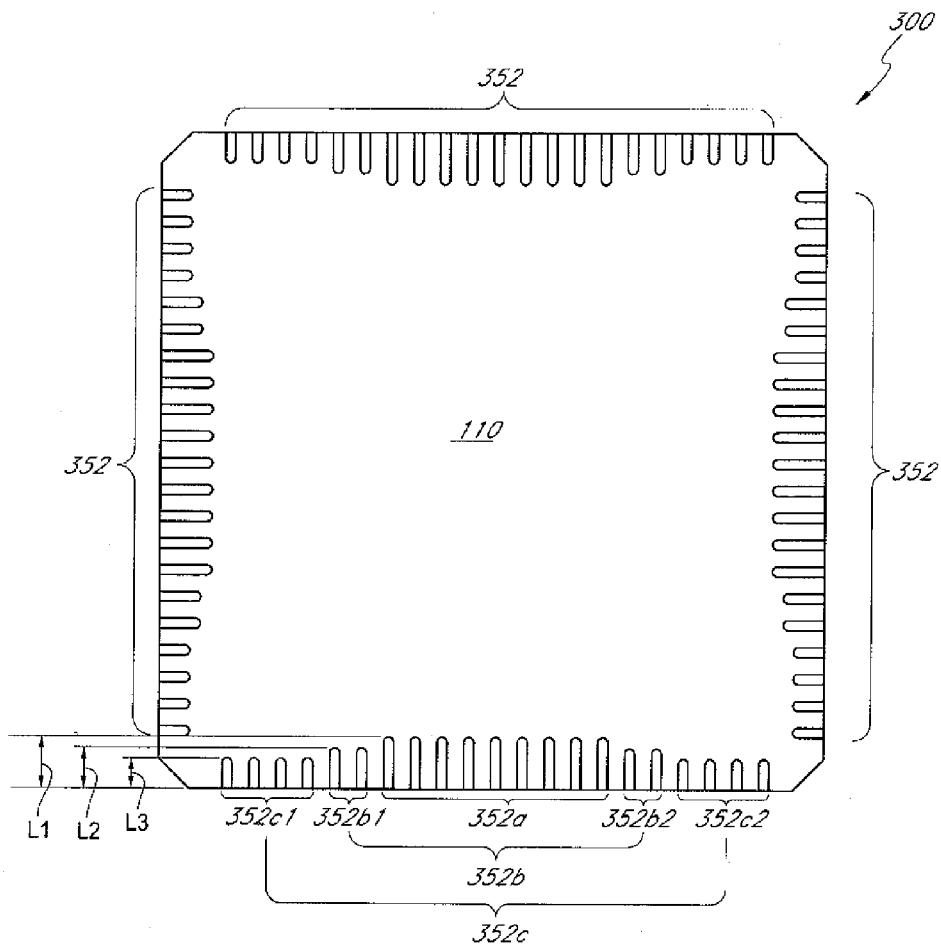
FIG. 3B is a bottom plan view of the QFN package of FIG. 3A.

FIG. 3B is a bottom plan view of the package 300. As shown in FIG. 3B, the exposed portions 352 of the leads are grouped to have different lengths L1, L2, L3. In the illustrated embodiment, there are three groups 352a, 352b, 352c of the exposed portions of the leads. The exposed portions of leads in a first group 352a are positioned in the middle along an edge of the bottom of the package 300, and have a first length L1. The first length L1 can be, for example, between about 0.6 mm and about 1.2 mm, for example, about 0.825 mm.

The exposed portions of leads in a second group 352b are grouped into two second sub-groups 352b1, 352b2 that interpose the first group 352a therebetween along the edge. The exposed portions of the leads in the second group 352b can have a second length L2 that is shorter than the first length L1. The second length L2 can be, for example, between about 0.5 mm and about 1.0 mm, for example, about 0.6 mm.

The exposed portions of leads in a third group 352c are grouped into two third sub-groups 352c1, 352c2 at the outer sides along the edge such that each of the second sub-groups 352b1, 352b2 is interposed between the first group 352a and a respective one of the third sub-groups 352c1, 352c2. The exposed portions of the leads in the third group 352c can have a third length L3 that is shorter than the second length L2. The third length L3 can be, for example, between about 0.4 mm and about 0.5 mm, for example, about 0.5 mm.

In the illustrated embodiment, the first group 352a, the second group 352b, and the third group 352c have 9 leads, 4 leads, and 8 leads, respectively. However, a skilled artisan will appreciate that the number of leads in each of the groups 352a-352c and the total number of leads can vary widely, depending on the application. Other details of the lead frame 350 can be as described above with respect to the lead frame 150 of FIG. 2C.

In the embodiment shown in FIG. 3B, the exposed portions of the leads on each of the four edges are grouped to have different lengths. In other embodiments, one or more, but less than all, of the four edges are provided with such groups of leads having different lengths, while at least one of the four edges is provided with leads having exposed portions of the same lengths.

In another embodiment, all the exposed portions of leads 352 at the bottom of the package 300 have different lengths from one another without forming such groups described above. In such an embodiment, an exposed portion closer to a corner of the bottom (where two edges meet) can be shorter than another exposed portion closer to the middle of an edge of the bottom. Longer leads can alternate with shorter leads near the middle of the edge, or the leads can continually increase toward a peak at the middle.

In certain embodiments, the PCB, onto which the package 300 is attached, can have lands for physical and electrical connection between the PCB and the package 300. Such lands can have different lengths corresponding to the different lengths of the leads of the package 300 so as to further enhance contact area and solder joint reliability.

Figure 3C:
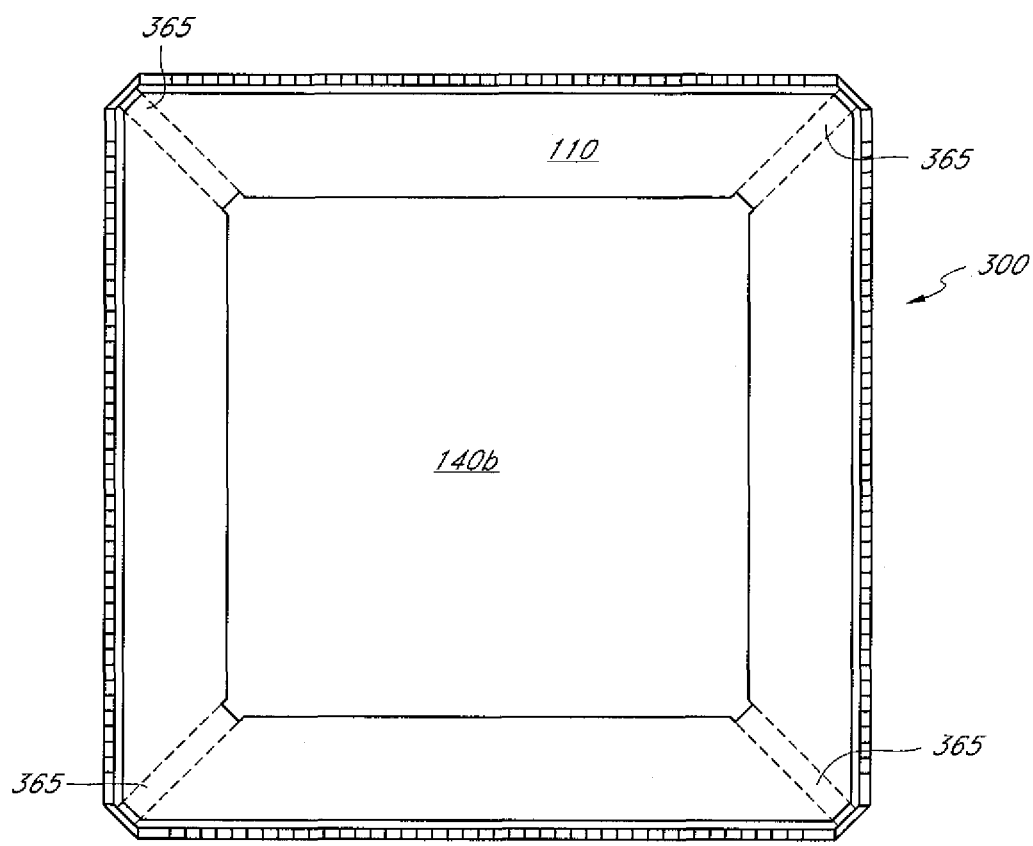
FIG. 3C is a top plan view of the QFN package of FIG. 3A.

FIG. 3C is a top plane view of the QFN package 300. Similar to FIG. 2B, the QFN package 300 has a thermal paddle 140b exposed through the top surface of the package 300. The QFN package 300 can also include tie bars 365 (denoted with dotted lines) below the top surface inside the encapsulation 110. The tie bars 365 are part of a lead frame, and are integrally formed with leads for easy handling. The die 120 (FIG. 3A) (or the paddle 140b in some embodiments) is attached to the tie bars 365 to be maintained in place with respect to the lead frame 350, and is molded within the encapsulation material 110 during manufacturing.

Figure 3D:
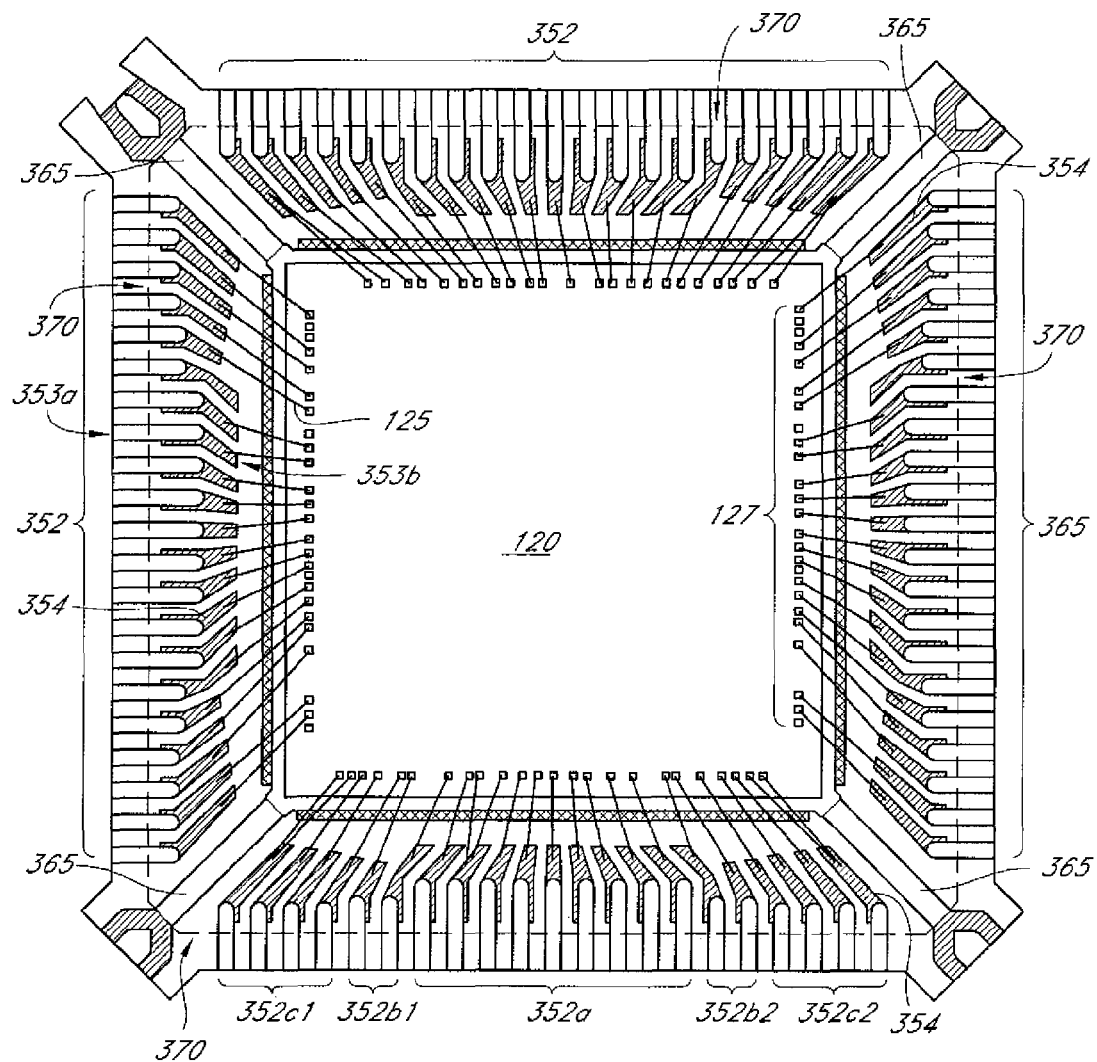
FIG. 3D illustrates a partially fabricated lead frame structure and a die to form the QFN package of FIG. 3A.

FIG. 3D is a bottom plan view of a partially fabricated QFN package 300 without the encapsulation 110 and still with connections to strips for the sake of explanation. After a singulation step during manufacturing, portions outside the dotted line 370 are removed, leaving only portions inside the dotted line 370 in the package 300.

FIG. 3D shows the die 120, the wire bonds 125, the internal portions 354 and exposed portions 352 of the leads, and the tie bars 365. The wire bonds 125 are arranged to connect the internal portions 354 of the leads to contact pads 127 of the die 120. Unlike the exposed portions 352 of the leads, at least one of the internal portions 354 of the leads is oriented toward a respective one of the contact pads 127 to which it is connected. Thus, the internal portions 354 of the leads do not necessarily extend parallel to one another, as shown in FIG. 3D. Further, the internal portions 354 of the leads may have different lengths, depending on the position.

In the illustrated embodiment, a plurality of leads is shown such that each of the leads has a first end 353a and a second end 353b. The first ends 353a of the plurality of leads are aligned with one another along an imaginary line. Each of the leads includes a first portion 352 (which forms an exposed portion after encapsulation) extending from the first end 353a of the lead, and a second portion 354 (which forms an internal portion 352 after encapsulation) extending from part of the first portion 352 to the second end 353b of the lead. The first portion 352 has a first thickness, and the second portion 354 has a second thickness thinner than the first thickness. The first portions 352 of the leads have variable lengths.

As shown in FIG. 3D, there is a limited space for the leads 352, 354 at or near the corners of the package 300 due in part to the existence of the tie bars 365 and the proximity of leads from the neighboring edge. While the longer the exposed portions 352 is, the better the solder joint reliability of the package 300 is, the third group 352c of leads can only have a length that can be accommodated by the limited space near the corners. The leads 352, 354 should not interfere with wire bonding. Thus, the third length L3 can be a maximum length that can be allowed by the space at or near the corners, and can be shorter than the first and second lengths L1, L2. A skilled artisan will appreciate that the first to third lengths L1-L3 can vary widely, depending on the dimensions and internal configuration of the package.

As described above, the lengths of the exposed portions 352 of the leads determine the contact area of solder joints. While the lengths L3 of the exposed portions near the corners are limited, the lengths L1, L2 of the other exposed portions can be made longer (to their maximum allowed lengths) than those at or near the corners to enhance solder joint reliability. Further, this configuration enhances solder joint reliability between the leads and PCB pads without necessarily changing other design factors (including the design of a PCB to which the package is attached), which allows easy adoption. Thus, despite the paddle-up design in which the paddle cannot contribute to bonding surface for mounting the package, good adhesion can be obtained.

Figure 4A:
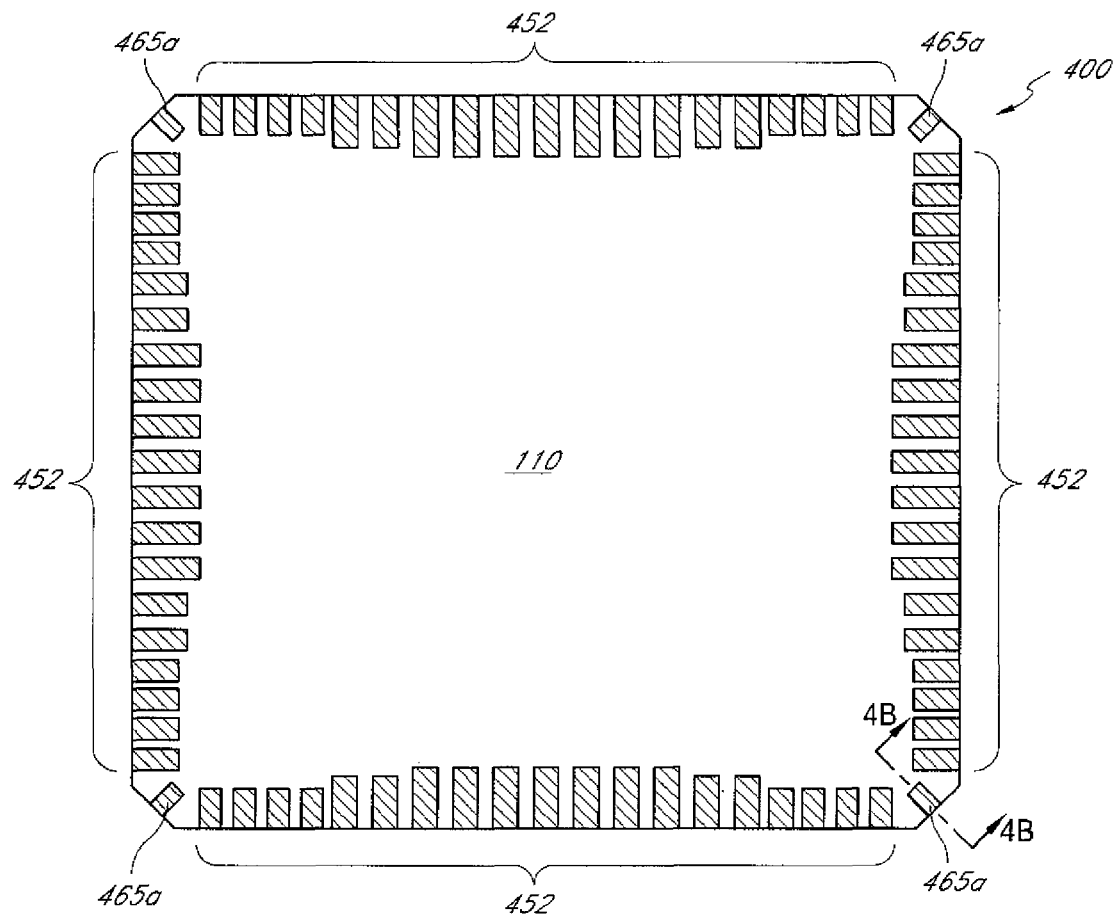
FIG. 4A is a bottom plan view of a QFN package with a paddle-up configuration having corner dummy pads according to another embodiment.
Figure 4B:
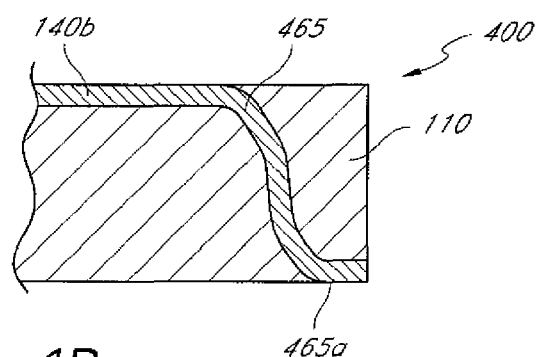
FIG. 4B is a cross-section of a portion of the QFN package of FIG. 4A, taken along the line 4B-4B.

Referring to FIGS. 4A and 4B, another embodiment of a QFN package with a paddle-up configuration will be described below. FIG. 4A is a bottom plan view of the QFN package 400. In the illustrated embodiment, the exposed portions 452 of leads are grouped to have different lengths, as described above in connection with FIG. 3B. Thus, details of the exposed portions 452 can be as described above with respect to FIG. 3B.

In addition to the exposed portions 452 of different lengths, the package 400 further includes tie bars 465 (FIG. 4B), portions of which are exposed through the bottom of the package 400. Such exposed portions 465a of the tie bars 465 are positioned at the corners of the bottom of the package 400. The exposed portions 465a of the tie bars 465 can also be referred to as "dummy pads" in the context of this document. As shown in FIG. 4B, the tie bars 465 can also be connected through the encapsulation 110 to the thermal paddle 140b exposed through the top surface of the package 400.

When the package 400 is fixed to a PCB or other electrical interface, solder joints can be provided between the exposed portions 452 of the leads and the PCB, and further between the dummy pads 465a of the tie bars 465 and the PCB. Thus, the solder joints contacting the leads 452 can share stresses with those contacting the tie bars 465, and thus solder joint reliability can be further improved in combination with the different lead lengths.

Figure 5:
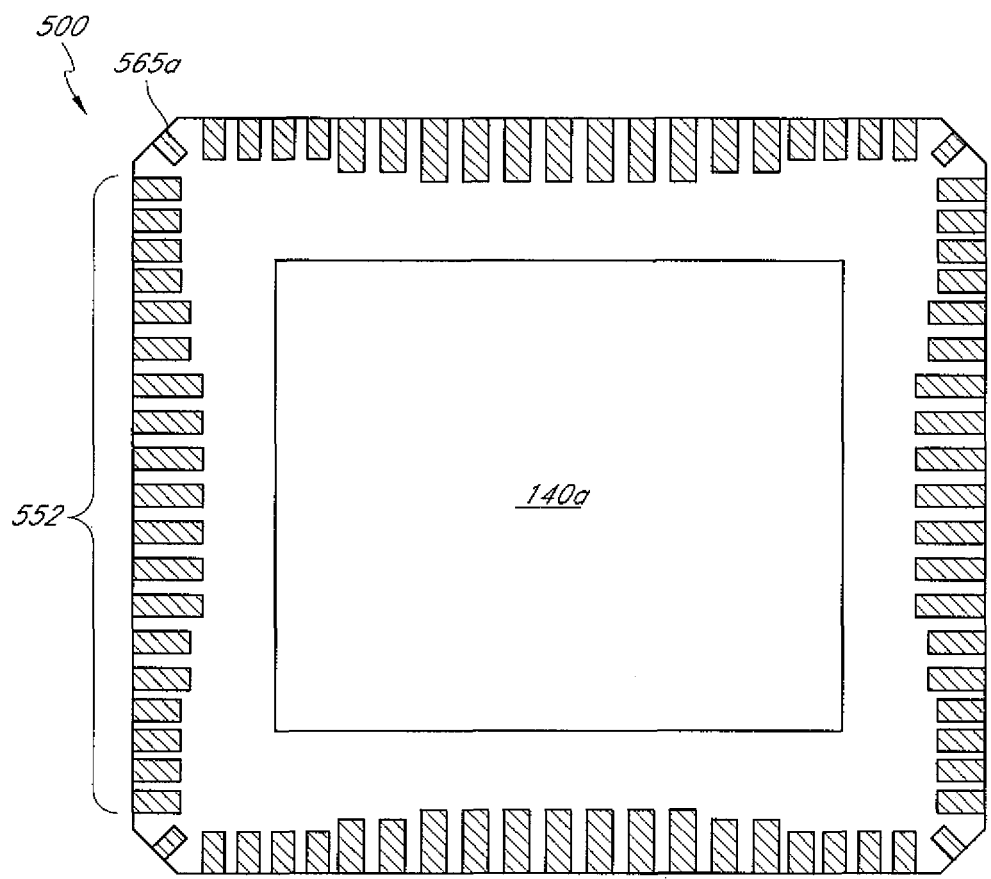
FIG. 5 is a bottom plan view of a QFN package with a paddle-down configuration having corner dummy pads according to another embodiment.

Referring to FIG. 5, yet another embodiment of a QFN package with a paddle-down configuration will be described below. FIG. 5 is a bottom plan view of the QFN package 500. In the illustrated embodiment, the bottom of the QFN package 500 includes an exposed portion of a thermal paddle 140a, exposed lead portions 552 with different lengths, and dummy pads 565a of tie bars. Details of the QFN package 500 can be as described above in connection with FIGS. 4A and 4B except that the QFN package 500 has a paddle-down configuration as in the package 100 of FIG. 1.

In another embodiment, a QFN package having a paddle-down configuration can have leads having exposed portions of different lengths, as described above in connection with FIGS. 3A-3D without exposed tie bars.

Figure 6:
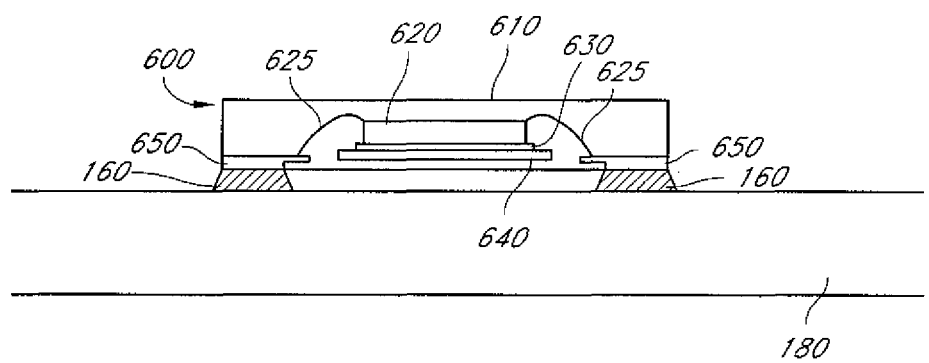
FIG. 6 is a cross-section of a hidden paddle lead frame chip scale package (LFCSP) with a paddle-down configuration according to another embodiment.

Referring to FIG. 6, a recessed or hidden paddle lead frame chip scale package (LFCSP) with a paddle-down configuration according to another embodiment will be described below. The illustrated package 600 includes an encapsulation 610, a die 620, bond wires 625, an adhesive 630, a thermal paddle 640, and a lead frame 650. The package 600 is shown attached to a printed circuit board (PCB) 180 using solder joints 160, 162. Unlike the packages 300, 400, 500, shown in FIGS. 3A-5, the thermal paddle 640 of the package 600 is embedded within the encapsulation with no exposure to outside the package 600.

In one embodiment, the bottom of the package 600 can be substantially the same as that of the package 300 of FIG. 3B. In other words, the bottom of the package 600 includes exposed lead portions with different lengths. In another embodiment, the bottom of the package 600 can be substantially the same as that of the package 400 of FIG. 4A, and thus has dummy pads of tie bars. Other details of the package 600 can be as described above with respect to the QFN package 100 with a paddle-down configuration of FIG. 1.

The configurations described in the above embodiments can provide improved solder joint reliability by increasing surface contact area for solder joints for a given package and lead frame configuration. In addition to countering thermo-mechanical stresses, the configurations can also improve board level mechanical robustness in the solder joints, such as resistance to drop, shock, vibration, pressure, and/or torque, by reducing mechanical stress in the solder joints. Further, the configurations of the embodiments can be formed without substantial modifications to the conventional lead frame technology for QFN packages.

EXAMPLES

A package having the configuration of the package 400 of FIGS. 4A and 4B (hereinafter, "Example 1") and a conventional JEDEC design package (hereinafter, "Comparative Example") were actually tested for solder joint reliability. Each of the Example 1 and the Comparative Example was an 84-lead inverted QFN package having a size of 10 mm×10 mm×0.85 mm. The package of Example 1 was found to have an improved solder joint reliability at least 2 times greater than that of the Comparative Example. In the test, the package of the Comparative Example had an expected life of less than 10 years whereas the package of the Example 1 had an expected life of at least 25 years.

Simulated Examples

A first package having the configuration of the package 300 of FIGS. 3A-3D (hereinafter, "Example A"), a second package having the configuration of the package 400 of FIGS. 4A and 4B (hereinafter, "Example B"), and a conventional JEDEC design package (hereinafter, "Comparative Example C") were modelled by simulation. The Examples A and B had exposed lead portions of different lengths, where the first length L1 was 0.825 mm, the second length L2 was 0.6 mm, and the third length L3 was 0.5 mm. The Comparative Example C had leads of the same exposed lead portion length of 0.5 mm.

The Examples A and B, and the Comparative Example C were subjected to a simulated accelerated environment at a temperature between about −40° C. and about 125° C. with 90 minutes per cycle and 30 minutes dwell time, and 15 minutes ramp time. A PCB used in the test had a thickness of about 3.6 mm. The Comparative Example C had its first failure after 260 cycles from the simulation. The Example A had its first failure after 361 cycles from the simulation. The Example B had its first failure after 407 cycles from the simulation.

Applications

The embodiments described above can be adapted for various types of integrated circuit packages, including, but not limited to: a Leadless Chip Carrier (LCC), and sawn and punched types of QFNs.

Further, the configurations and principles of the embodiments can be adapted for other applications, including, but not limited to, microelectromechanical systems (MEMS) device packaging. In an embodiment in which a MEMS package includes leads of different lengths, the lengths of the leads can be tuned to shift the resonant frequency of the package to be different from the operational frequency of MEMS elements inside the package. Such a configuration can enhance the solder joint reliability of the package.

Packages employing the above described configurations can be used for various electronic devices. Examples of the electronic devices can include, but are not limited to, consumer electronic products, parts of the consumer electronic products, electronic test equipments, etc. The consumer electronic products can include, but are not limited to, a mobile phone, cellular base stations, a telephone, a television, a computer monitor, a computer, a hand-held computer, a netbook, a tablet computer, a digital book, a personal digital assistant (PDA), a stereo system, a cassette recorder or player, a DVD player, a CD player, a VCR, a DVR, an MP3 player, a radio, a camcorder, a camera, a digital camera, a portable memory chip, a copier, a facsimile machine, a scanner, a multi functional peripheral device, a wrist watch, a clock, etc. Further, the electronic device can include unfinished products.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:
1. A die package comprising:
an encapsulation having a top surface and a bottom surface, the bottom surface facing away from the top surface;
a die embedded in the encapsulation; and a leadframe comprising a plurality of leads, each of the leads including an outer portion distal from the die and an inner portion proximate the die, each outer portion being exposed through the bottom surface of the encapsulation, wherein at least one of the outer portions positioned along one edge of the die package has an exposed length different from exposed lengths of other outer portions along the edge, and wherein a plurality of the leads along the edge have their inner portions angled inwardly towards the die relative to the outer portions of the corresponding leads.

2. The package of claim 1, wherein the bottom of each outer portion is flush with the bottom surface of the encapsulation.

3. The package of claim 1, wherein the die comprises a plurality of contact pads, and wherein a plurality of the inner portions are wire bonded to the contact pads of the die.

4. The package of claim 1, wherein the exposed length of each outer portion extends substantially perpendicular to the edge.

5. The package of claim 1, wherein the edge of the die package includes a middle region and two corner regions, and wherein inner portions near the corner regions are angled towards the die at angles greater than inner portions near the middle region.

6. The package of claim 1, wherein inner portions of adjacent ones of the leads along the edge are not parallel.

7. The package of claim 1, wherein inner portions of adjacent ones of the leads along the edge have different lengths.

8. The package of claim 7, wherein the inner portion of a first one of the adjacent leads is near a corner region of the edge, wherein the inner portion of a second one of the adjacent leads is closer to a middle region of the edge, and wherein a length of the inner portion of the first one is greater than a length of the inner portion of the second one.

9. The package of claim 1, wherein each inner portion is embedded in the encapsulation such that the encapsulation covers a top surface and a bottom surface of each of the inner portions.

10. The package of claim 9, wherein each inner portion has a thickness thinner than a thickness of the corresponding outer portion.

11. The package of claim 9, wherein the die is mounted on a thermal paddle exposed through the top surface of the encapsulation, and wherein wire bonds connect the die to bottom surfaces of the inner portions of a plurality of the leads.

12. The package of claim 1, wherein the outer portions of the leads positioned along the edge are grouped into a plurality of groups such that outer portions in the same group have the same length as one another, and the length of the outer portions in one group are different from the length of the outer portions in a different group.

13. The package of claim 1, further comprising a thermal paddle attached to the die and exposed through the top surface.

14. The package of claim 1, further comprising a thermal paddle attached to the die and exposed through the bottom surface.

15. The package of claim 1, wherein the die package comprises a quad flat no lead (QFN) package.

16. The package of claim 1, wherein the die comprises an integrated circuit or a microelectromechanical systems (MEMS) device within the encapsulation.

17. A lead frame for a die package, comprising:

a die paddle; and a plurality of leads, each of which has an outer portion and an inner portion, wherein the outer portions of the leads are aligned with one another, wherein at least one of the inner portions is angled towards the die paddle relative to the outer portion of the corresponding lead, wherein at least one of the outer portions of the leads has a length different from the lengths of the outer portions of others of the leads, and wherein the outer portions have a first thickness and the inner portions have a second thickness thinner than the first thickness, and wherein the inner portions are recessed from a bottom surface of the outer portions.

18. The lead frame of claim 17, wherein a length of at least one inner portion is different from a length of another inner portion.

19. A lead frame for a die package, comprising:

a die paddle; and a plurality of leads, each of which has an outer portion and an inner portion, wherein the outer portions of the leads are aligned with one another, wherein at least one of the inner portions is angled towards the die paddle relative to the outer portion of the corresponding lead, wherein at least one of the outer portions of the leads has a length different from the lengths of the outer portions of others of the leads, and wherein a length of at least one inner portion is different from a length of another inner portion.

* * * * *